(12) United States Patent
Ishiwata et al.

(10) Patent No.: US 7,496,332 B2
(45) Date of Patent: Feb. 24, 2009

(54) DIPLEXER

(75) Inventors: Hiroyuki Ishiwata, Fukushima-ken (JP); Takashi Tanemura, Fukushima-ken (JP); Akiyuki Yoshisato, Fukushima-ken (JP); Masami Miyazaki, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 596 days.

(21) Appl. No.: 11/061,075

(22) Filed: Feb. 17, 2005

(65) Prior Publication Data

US 2005/0192047 A1 Sep. 1, 2005

(30) Foreign Application Priority Data

Feb. 26, 2004 (JP) ............................. 2004-051479

(51) Int. Cl.
*H04B 1/40* (2006.01)
(52) U.S. Cl. .................... 455/88; 455/552.1; 455/553.1
(58) Field of Classification Search .................. 455/88, 455/552.1, 553.1, 78
See application file for complete search history.

(56) References Cited

U.S. PATENT DOCUMENTS

| | | | |
|---|---|---|---|
| 5,880,649 A * | 3/1999 | Tai et al. | ...................... 333/132 |
| 6,366,564 B1 | 4/2002 | Hiraka et al. | |
| 7,307,494 B2 * | 12/2007 | Erb | ............................. 333/126 |
| 2007/0191055 A1 * | 8/2007 | Kovacs et al. | ............ 455/552.1 |

FOREIGN PATENT DOCUMENTS

| | | |
|---|---|---|
| DE | 296 16 799 | 5/1996 |
| EP | 0 793 289 | 9/1997 |
| JP | 55149518 | 11/1980 |
| JP | 2000068774 | 3/2000 |
| JP | 2000082932 | 3/2000 |
| JP | 2001160729 | 6/2001 |
| JP | 2003-69362 | 3/2003 |
| JP | 2003069362 | 7/2003 |

OTHER PUBLICATIONS

*Design of Diplexers with Maximally Flat Response and Frequency Symmetry*, Dr. Koyza et al., Electrotechnical Conference, 1994. Proceedings., 7th Mediterranean Antalya, Turkey Apr. 12-14, 1994, New York, NY, USA, IEEE, Apr. 12, 1994, pp. 512-515.

* cited by examiner

*Primary Examiner*—Yuwen Pan
(74) *Attorney, Agent, or Firm*—Brinks Hofer Gilson & Lione

(57) ABSTRACT

A diplexer contains a common terminal connected to an antenna, a first input/output terminal for inputting/outputting signals of a plurality of high frequency bands higher than a predetermined frequency, and a second input/output terminal for inputting/outputting signals of low frequency bands lower than the predetermined frequency. Between the common terminal and the first input/output terminal, a high pass filter and low trap circuits for attenuating the low frequency bands respectively are interposed in series, and, between the common terminal and the second input/output terminal, a low pass filter and high trap circuits for attenuating the high frequency bands respectively are interposed in series.

4 Claims, 3 Drawing Sheets

DIPLEXER

This application claims the benefit of priority to Japanese Patent Application No. 2004-051479 filed on Feb. 26, 2004, herein incorporated by reference.

BACKGROUND OF THE INVENTION

1. Field of the Invention

The present invention relates to a diplexer which can be used for a transceiver or the like.

2. Description of the Related Art

FIG. 5 shows a conventional diplexer. The diplexer has a low pass filter circuit comprising coils L1 and L2 and capacitors C1 to C4 and a high pass filter circuit comprising a coil L3 and capacitors C5 to C7. One end of the low pass filter circuit and one end of the high pass filter circuit are connected with each other to serve as a common terminal. The other end of the low pass filter circuit serves as a low pass filter terminal, and the other end of the high pass filter circuit serves as a high pass filter terminal. In the low pass filter circuit, a parallel resonance circuit having a resonance frequency higher than a second frequency is provided near the common terminal and comprises the coil L1 and capacitor C1 which are connected in parallel with each other.

Further, a parallel resonance circuit having a resonance frequency twice as large as a first frequency (the range of from 880 to 960 MHz) or the second frequency (the range of from 1710 to 2170 MHz) is provided near the low pass filter terminal and comprises the coil L2 and the capacitor C2 which are connected in parallel with each other. Then, the parallel resonance circuits are connected with each other. The capacitor C3 is provided at the connection of the parallel resonance circuit comprising the coil L1 and the capacitor C1 and the parallel resonance circuit comprising the coil L2 and the capacitor C2, and the capacitor C4 is provided near the low pass filter terminal. Each of the capacitors C3 and C4 serves a ground capacitor.

Further, in the high pass filter circuit, the capacitors C5 and C6 are connected in series between the common terminal and the high pass filter terminal. The connection of the capacitors C5 and C6 is grounded via a series resonance circuit comprising the coil L3 and the capacitor C7. Accordingly, the high pass filter circuit with an attenuation pole is constructed (for example, see Japanese Unexamined Patent Application Publication No. 2003-069362 (FIG. 1)).

In the above-mentioned configuration, when the low pass filter circuit transmits signals in a plurality of different frequency bands and similarly the high pass filter circuit transmits signals in a plurality of different frequency bands, for example, the low pass filter circuit does not sufficiently reflect the signals in the respective frequency bands which the high pass filter transmits, and the high pass filter circuit does not sufficiently reflect the signals in the respective frequency bands which the low pass filter transmits. Thus, it becomes difficult to transmit the signals in the plurality of different frequency bands without loss.

SUMMARY OF THE INVENTION

The present invention is to suppress loss of signals in a plurality of frequency bands which a high pass filter and a low pass filter transmit respectively.

In order to solve the above-mentioned problems, there is provided a diplexer according to the present invention comprising a common terminal connected to an antenna, a first input/output terminal for inputting/outputting signals in a plurality of high frequency bands larger than a predetermined frequency, and a second input/output terminal for inputting/outputting signals in a plurality of low frequency bands smaller than the predetermined frequency. Between the common terminal and the first input/output terminal, a high pass filter and a plurality of low trap circuits for attenuating the plurality of low frequency bands respectively are interposed in series, and, between the common terminal and the second input/output terminal, a low pass filter and a plurality of high trap circuits for attenuating the plurality of high frequency bands respectively are interposed in series.

Further, the high pass filter has at least a mid-section m-derived high pass filter, and a frequency of an attenuation pole of the m-derived high pass filter is set to be close to the lowest frequency or the highest frequency of one of the low frequency bands.

Further, the low pass filter has at least a mid-section m-derived low pass filter, and a frequency of an attenuation pole of the m-derived low pass filter is set to be close to the highest frequency or the lowest frequency of one of the high frequency bands.

Further, each of the low trap circuit comprises a parallel resonance circuit of an inductive element and a capacitive element and is interposed between the common terminal and the high pass filter, the m-derived high pass filter comprises a parallel m-derived high pass filter, and the common terminal is grounded in a direct-current wise via the inductive element of the parallel resonance circuit and an inductive element constituting the parallel m-derived high pass filter in series.

Further, the plurality of low frequency bands are transmission/reception frequency bands for a GSM system and transmission/reception frequency bands for a DCS system and a PCS system, and the plurality of high frequency bands are transmission/reception frequency bands of a Bluetooth system and transmission/reception frequency bands of a wireless LAN system.

According to the present invention, between the common terminal and the first input/output terminal, the high pass filter and the plurality of low trap circuits for attenuating the plurality of low frequency bands respectively are interposed in series, and, between the common terminal and the second input/output terminal, the low pass filter and the plurality of high trap circuits for attenuating the plurality of high frequency bands respectively are interposed in series. Thus, transmission characteristics of the signals of the respective frequency bands become favorable. Further, the signals in the low frequency bands and the signals of the high frequency bands are prevented from interfering with the signals in the high frequency bands and the signals in the low frequency bands.

According to the present invention, the high pass filter has at least the mid-section m-derived high pass filter, and the frequency of the attenuation pole of the m-derived high pass filter is set to be close to the lowest frequency or the highest frequency of one of the low frequency bands. Thus, transmission characteristics in the low frequency bands to be damaged under the influence of the respective low trap circuits can be flattened.

According to the present invention, the low pass filter has at least the mid-section m-derived low pass filter, and the frequency of the attenuation pole of the m-derived low pass filter is set to be close to the highest frequency or the lowest frequency of one of the high frequency bands. Thus, transmission characteristics in the high frequency bands to be damaged under the influence of the respective high trap circuits can be flattened.

According to the present invention, each of the low trap circuits comprises the parallel resonance circuit of the inductive element and the capacitive element and is interposed between the common terminal and the high pass filter. The m-derived high pass filter comprises the parallel m-derived high pass filter. Further, the common terminal is grounded in the direct-current wise via the inductive element of the parallel resonance circuit and the inductive element constituting the parallel m-derived high pass filter. Thus, static electricity applied to the common terminal can be discharged and a transceiver circuit connected to each input/output terminal can be protected from an electrostatic damage.

According to the present invention, the plurality of low frequency bands are transmission/reception frequency bands of the GSM system and transmission/reception frequency bands of the DCS system and the PCS system, and the plurality of high frequency bands are transmission/reception frequency bands of the Bluetooth system and transmission/reception frequency bands of the wireless LAN system. Thus, a diplexer for mobile phone which is common to the above-described four systems can be implemented.

DESCRIPTION OF THE PREFERRED EMBODIMENT

Figure 1:
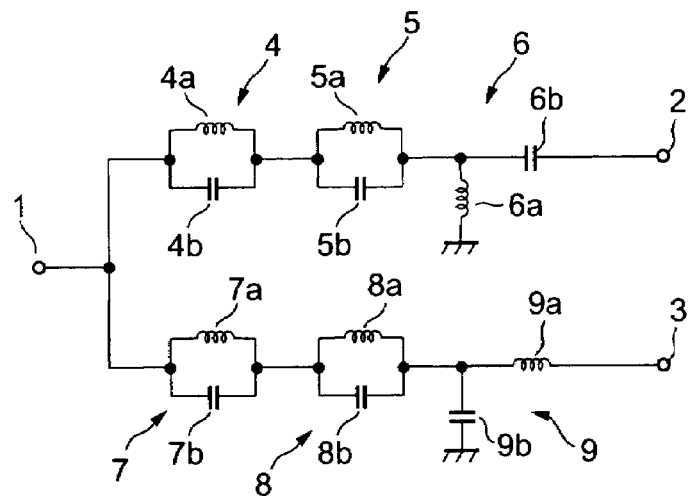
FIG. 1 is a circuit diagram showing a configuration of a diplexer according to the present invention.

FIG. 1 shows a circuit configuration according to a first embodiment of the present invention. Between a common terminal 1 for connecting with an antenna and a first input/output terminal 2, signals in frequency bands higher than a predetermined frequency (for example, 2.2 GHz) transmits, and, between the common terminal 1 and a second input/output terminal 3, signals in frequency bands lower than the predetermined frequency transmits. Further, between the common terminal 1 and the first input/output terminal 2, two low trap circuits 4 and 5 and a high pass filter 6 are interposed in series. The first low trap circuit 4 comprises a parallel resonance circuit of an inductive element 4a and a capacitive element 4b and attenuates a low frequency band, for example, a transmission/reception frequency band (the band ranging from 806 MHz to 960 MHz) for a GSM system.

The second low trap circuit 5 also comprises a parallel resonance circuit of an inductive element 5a and a capacitive element 5b and attenuates a low frequency band, for example, a transmission/reception frequency band (the band ranging from 1710 MHz to 1990 MHz) for a DCS system, a PCS system, and so on. Thus, as a resonance frequency of the first low trap circuit 4, a frequency close to an immediate frequency in the transmission/reception frequency band for the GSM system, for example, 920 MHz is selected, and as a resonance frequency of the second low trap circuit 5, a frequency close to an immediate frequency in the transmission/reception frequency band for the DCS system and the PCS system, for example, 1900 MHz is selected.

In addition, the first low trap circuit 4 is disposed near the common terminal 1, and the high pass filter 6 is disposed near the first input/output terminal 2. Further, the second low trap circuit 5 is interposed between the first low trap circuit 4 and the high pass filter 6.

The high pass filter 6 has a mid-section high pass filter, in which an inductive element 6a is connected between an output terminal of the second low trap circuit 5 and a ground and a capacitive element 6b is connected between the output terminal of the second low trap circuit 5 and the first input/output terminal 2.

Moreover, between the common terminal 1 and the second input/output terminal 3, two high trap circuits 7 and 8 and a low pass filter 9 are interposed in series. The first high trap circuit 7 comprises a parallel resonance circuit of an inductive element 7a and a capacitive element 7b and attenuates the high frequency band, for example, the transmission/reception frequency band (the band ranging from 2.4 GHz to 2.5 GHz) for a Bluetooth (hereafter, simply referred to as BT) (Registered Trademark in the name of NOKIA and so on) system.

The second high trap circuit 8 also comprises a parallel resonance circuit of an inductive element 8a and a capacitive element 8b and attenuates the high frequency band, for example, the transmission/reception frequency band (the band ranging from 4.9 GHz to 6.0 GHz) for a wireless LAN system. Thus, as a resonance frequency of the first high trap circuit 7, a frequency close to an immediate frequency of the transmission/reception frequency band for the Bluetooth system, for example, 2.45 GHz is selected, and as a resonance frequency of the second high trap circuit 8, a frequency close to an immediate frequency of the transmission/reception frequency band for the wireless LAN system, for example, 5.5 GHz is selected.

Further, the first high trap circuit 7 is disposed near the common terminal 1, and the low pass filter 9 is disposed near the second input/output terminal 3. Then, the second high trap circuit 8 is interposed between the first high trap circuit 7 and the low pass filter 9.

The low pass filter 9 has a mid-section low pass filter, in which an inductive element 9a is connected between an output terminal of the second high trap circuit 8 and the second input/output terminal 3 and a capacitive element 9b is connected between the output terminal of the second high-band trap circuit 8 and the ground.

Figure 2:
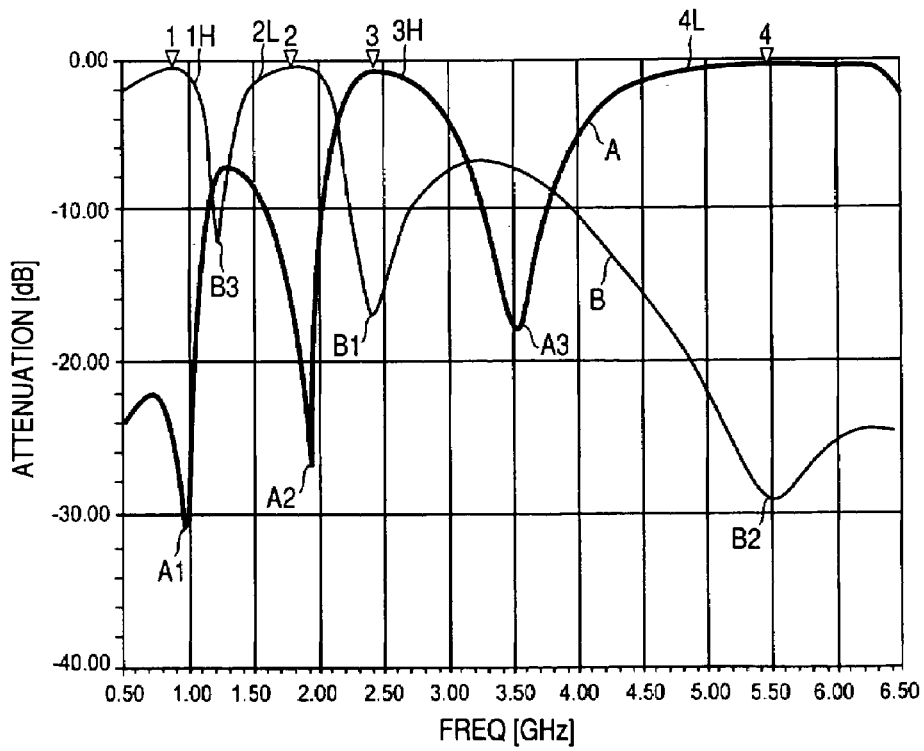
FIG. 2 is a transmission characteristic diagram of the diplexer according to the present invention.

In the above-mentioned configuration, transmission characteristics between the common terminal 1 and the first input/output terminal 2 and transmission characteristics between the common terminal 1 and the second input/output terminal 3 are indicated by A and B in FIG. 2 respectively. In FIG. 2, frequency points 1 to 4 respectively indicates the positions of the intermediate frequency in the transmission/reception frequency bands for the GSM system, the transmission/reception frequency band for the DCS system and the PCS system, the transmission/reception frequency band for the Bluetooth system, and the transmission/reception frequency band for the wireless LAN system.

In the transmission characteristic A, attenuation poles A1 and A2 are respectively generated by the first low trap circuit 4 and the second low trap circuit 5. At the frequencies of the attenuation poles A1 and A2, since the signals in the transmission/reception frequency band for the GSM system and the signals in the transmission/reception frequency band for the DCS system and the PCS system, which are input to the common terminal 1, are reflected by the first and second low trap circuits 4 and 5, the signals are efficiently output to the second input/output terminal 3. Therefore, as indicated by the transmission characteristic B, the attenuation at each of the frequency points 1 and 2 becomes extremely small. In addition, the signals in the transmission/reception frequency band for the GSM system and the signals in the transmission/reception frequency band for the DCS system and the PCS system do not interfere with the signals in the transmission/reception frequency band for the Bluetooth system and the signals in the transmission/reception frequency band for the wireless LAN system.

Further, in the transmission characteristic B, attenuation poles B1 and B2 are respectively generated by the first high trap circuit 7 and the second high trap circuit 8. At the frequencies of the attenuation poles B1 and B2, the signals in the transmission/reception frequency band for the Bluetooth system and the signals in the transmission/reception frequency band for the wireless LAN system, which are input to the common terminal 1, are reflected by the first and second high trap circuits 7 and 8, the signals are efficiently output to the first input/output terminal 2. Therefore, as indicated by the transmission characteristic A, the attenuation at each of the frequency points 3 and 4 becomes extremely small. In addition, the signals in the transmission/reception frequency band for the Bluetooth system and the signals in the transmission/reception frequency band for the wireless LAN system do not interfere with the signals in the transmission/reception frequency band for the GSM system and the signals in the transmission/reception frequency band for the DCS system and the PCS system.

Moreover, in the transmission characteristic A, an attenuation pole A3 is generated by series resonance of the first and second high-band trap circuit 7 and 8 and the capacitive element 9b of the low pass filter 9 and appears between the attenuation pole B1 and the attenuation pole B2. Therefore, unnecessary signals between the transmission and reception frequency band of the Bluetooth system the transmission and reception frequency band of the wireless LAN system is attenuated, thereby interference by these unnecessary signals is reduced.

Similarly, in the transmission characteristic B, an attenuation pole B3 is generated by series resonance of the first and second low trap circuits 4 and 5 and the inductive element 6a of the high pass filter 6 and appears as a frequency between the attenuation pole A1 and the attenuation pole A2. Therefore, unnecessary signals between the transmission/reception frequency band for the GSM system and the transmission/reception frequency band for the DCS system and the PCS system are attenuated, thereby reducing interference caused by these unnecessary signals.

Figure 3:
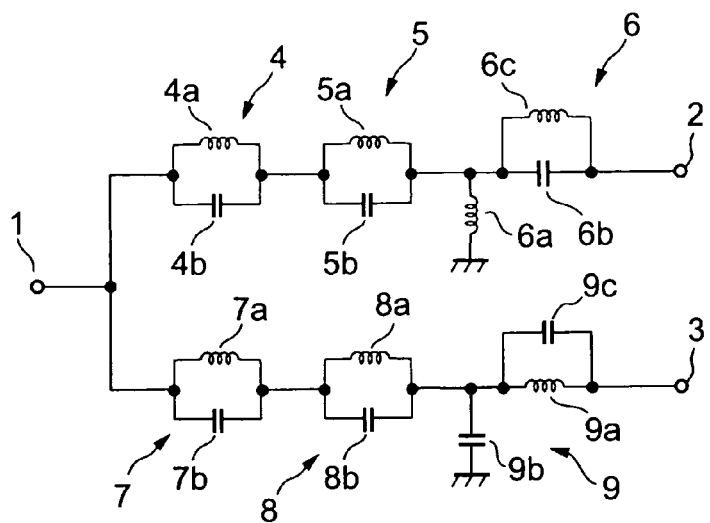
FIG. 3 is a circuit diagram showing a configuration of another diplexer according to the present invention.

In the configuration shown in FIG. 1, with the attenuation poles B3 and A3, for example, attenuation occurs around the lowest frequency of the transmission/reception frequency band for the DCS system or the PCS system (at a lower side (indicated by 2L) of the frequency point 2), such that the transmission characteristic of the transmission/reception frequency band for the DCS system and the PCS system is inclined. Further, attenuation occurs around the highest frequency of the transmission/reception frequency band for the Bluetooth system (at an upper side (indicated by 3H) of the frequency point 3), such that the transmission characteristic of the transmission/reception frequency band for the Bluetooth system is inclined. Therefore, as shown in FIG. 3, the high pass filter 6 is constituted as a parallel m-derived high pass filter in which the inductive element 6c is connected in parallel to the capacitive element 6b of the high pass filter, and the attenuation pole frequency of the high pass filter 6 is set at the lower side (2L). Similarly, the low pass filter 9 is constituted as a parallel m-derived low pass filter in which the capacitive element 9c is connected in parallel to the inductive element 9a of the low pass filter 9, and the attenuation pole frequency of the low pass filter 9 is set at the upper side (3H).

Figure 4:
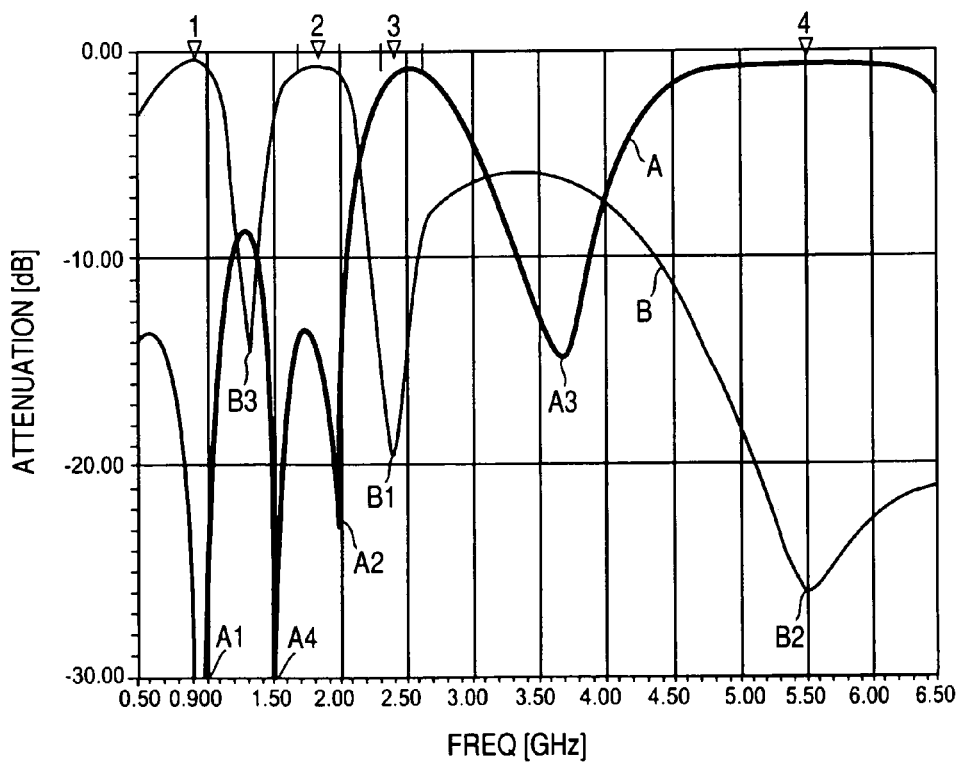
FIG. 4 is a transmission characteristic diagram of another diplexer according to the present invention.
Figure 5:
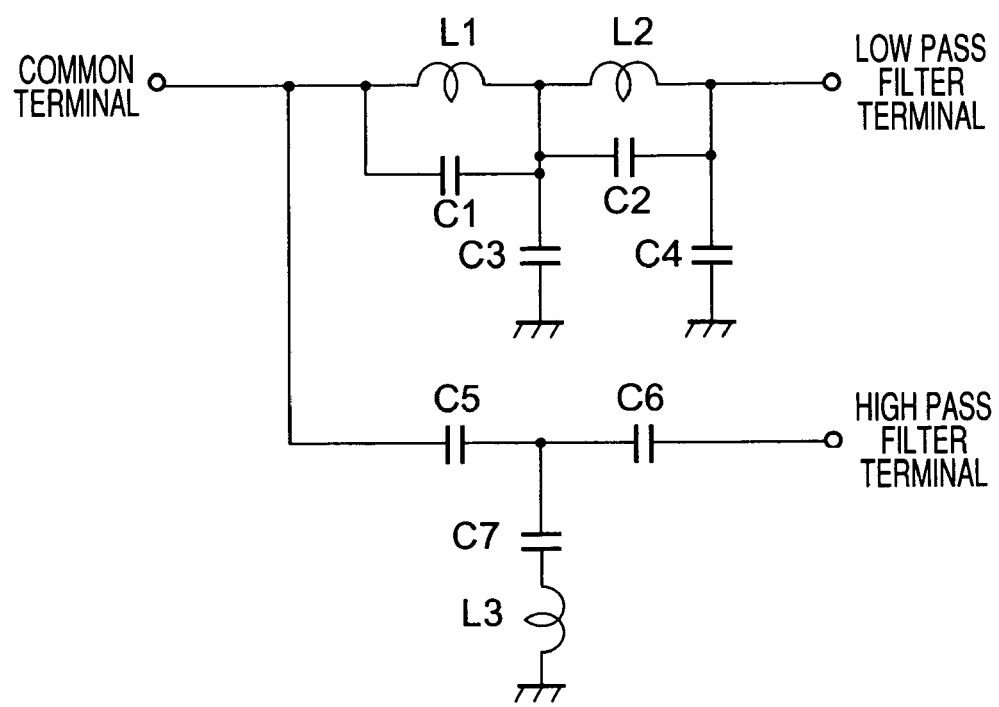
FIG. 5 is a circuit diagram showing a conventional diplexer.

According to the configuration, as shown in FIG. 4, an attenuation pole A4 appears at the lower side of the transmission/reception frequency band for the DCS system and the PCS system and the lower-side signals of the transmission/reception frequency band for the DCS system or the PCS system, which are input to the common terminal 1, are reflected by the attenuation pole A4 of the high pass filter 6. The reflected signals are output to the second input/output terminal 3. Therefore, as indicated by B in FIG. 4, the transmission characteristic around the frequency point 2 is flattened. Similarly, the upper-side signals of the transmission/reception frequency band for the Bluetooth system, which are input to the common terminal 1, are reflected by the low pass filter, and thus the reflected signals are output to the first input/output terminal 2. Therefore, as indicated by A in FIG. 4, the transmission characteristic around the frequency point 3 is flattened.

In addition, when the attenuation around the highest frequency of the transmission/reception frequency band for the GSM system (at the upper side (indicated by 2H) of the frequency point 1) is corrected by the attenuation pole B3, the attenuation pole frequency of the high pass filter 6 may be set around the highest frequency of the transmission/reception frequency band for the GSM system, and when the attenuation around the lowest frequency of the transmission/reception frequency band for the wireless LAN system (at the lower side (indicated by 3L) of the frequency point 4) is corrected by the attenuation pole A3, the attenuation pole frequency of the low pass filter 9 may be set around the lowest frequency of the transmission/reception frequency band for the wireless LAN system.

Further, in the configurations in FIGS. 1 and 3, since the common terminal 1 is grounded via the inductive element 4a of the first low trap circuit 4, the inductive element 5a of the second low trap circuit 5, and the inductive element 6a of the high pass filter 6 in series, static electricity applied to the common terminal is discharged through the respective inductive elements, thereby protecting the transceiver circuit connected to the first and second input/output terminals 2 and 3 from breakdown.

What is claimed is:

1. A diplexer comprising:
    a common terminal connected to an antenna;
    a first input/output terminal for inputting/outputting signals in a plurality of high frequency bands higher than a predetermined frequency; and
    a second input/output terminal for inputting/outputting signals in a plurality of low frequency bands lower than the predetermined frequency,
    wherein, between the common terminal and the first input/output terminal, a high pass filter and a plurality of low trap circuits for attenuating the plurality of low frequency bands respectively are interposed in series in which a series resonance frequency of the plurality of low trap circuits and an inductive element of the high pass filter is between the plurality of low frequency bands attenuated by the plurality of low trap circuits, the number of low frequency bands to be attenuated is larger than the number of low trap circuits and,
    wherein, between the common terminal and the second input/output terminal, a low pass filter and a plurality of high trap circuits for attenuating the plurality of high frequency bands respectively are interposed in series in which a series resonance frequency of the plurality of high trap circuits and a capacitive element of the low pass filter is between the plurality of high frequency bands attenuated by the plurality of high trap circuits, the number of high frequency bands to be attenuated is larger than the number of high trap circuits.

2. The diplexer according to claim 1,
wherein each of the low trap circuits comprises a parallel resonance circuit of an inductive element and a capacitive element and is interposed between the common terminal and the high pass filter, the m-derived high pass filter comprises a parallel m-derived high pass filter, and the common terminal is grounded via the inductive element of the parallel resonance circuit and an inductive element constituting the parallel m-derived high pass filter in series.

3. The diplexer according to claim 2 further comprising a second inductive element connected in parallel to a capacitive element of the m-derived high pass filter such that an attenuated frequency thereof is between the plurality of low frequency bands attenuated by the plurality of low trap circuits and a capacitive element connected in parallel to an inductive element of the m-derived low pass filter such that an attenuated frequency thereof is between the plurality of high frequency bands attenuated by the plurality of high trap circuits.

4. The diplexer according to claim 1,
wherein the plurality of low frequency bands are transmission/reception frequency bands for a GSM system and transmission/reception frequency bands for a DCS system and a PCS system, and the plurality of high frequency bands are transmission/reception frequency bands for a Bluetooth system and transmission/reception frequency bands for a wireless LAN system.

* * * * *